(12) United States Patent
Sikka et al.

(10) Patent No.: US 12,183,702 B2
(45) Date of Patent: Dec. 31, 2024

(54) ELECTRONIC PACKAGE WITH VARYING INTERCONNECTS

(71) Applicant: International Business Machines Corporation, Armonk, NY (US)

(72) Inventors: Kamal K. Sikka, Poughkeepsie, NY (US); Charles Leon Arvin, Poughkeepsie, NY (US); Thomas Edward Lombardi, Poughkeepsie, NY (US); Piyas Bal Chowdhury, Mountain View, CA (US); Alfred Grill, White Plains, NY (US); Steven Lorenz Wright, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 190 days.

(21) Appl. No.: 17/645,424

(22) Filed: Dec. 21, 2021

(65) Prior Publication Data

US 2023/0197658 A1 Jun. 22, 2023

(51) Int. Cl.
*H01L 23/00* (2006.01)
*H01L 25/065* (2023.01)

(52) U.S. Cl.
CPC .............. *H01L 24/14* (2013.01); *H01L 24/13* (2013.01); *H01L 25/0655* (2013.01); *H01L 24/11* (2013.01); *H01L 24/16* (2013.01); *H01L 24/73* (2013.01); *H01L 24/92* (2013.01); *H01L 2224/1146* (2013.01); *H01L 2224/13014* (2013.01); *H01L 2224/1403* (2013.01); *H01L 2224/14051* (2013.01); *H01L 2224/14131* (2013.01); *H01L 2224/16225* (2013.01); *H01L 2224/73204* (2013.01); *H01L 2224/92125* (2013.01)

(58) Field of Classification Search
CPC ..... H01L 24/14; H01L 24/13; H01L 25/0655; H01L 24/11; H01L 24/16; H01L 24/73; H01L 24/92; H01L 2224/1146; H01L 2224/13014; H01L 2224/1403; H01L 2224/14051; H01L 2224/14131; H01L 2224/16225; H01L 2224/73204; H01L 2224/92125; H01L 24/17
See application file for complete search history.

(56) References Cited

U.S. PATENT DOCUMENTS 8,779,588 B2 * 7/2014 Yu ..................... H01L 23/49811
257/737
9,799,618 B1 10/2017 Arvin et al.
(Continued)

*Primary Examiner* — Joshua L Schwartz
*Assistant Examiner* — Tiberiu Dan Onuta
(74) *Attorney, Agent, or Firm* — Patterson + Sheridan, LLP

(57) ABSTRACT

A flip chip device and methods for fabrication are provided. An interconnect layer for a device include a plurality of solder bumps arranged within the interconnect layer. A first subset of the plurality of solder bumps has a first cross-sectional area, where the first subset is arranged along a first position at a first edge of the interconnect layer. A second subset of the plurality of solder bumps has a second cross-sectional area, where the second subset is arranged at a second position of the interconnect layer. A third subset of the plurality of solder bumps is arranged between the first position and the second position, where the third subset has a plurality of cross-sectional areas.

20 Claims, 16 Drawing Sheets

(56) References Cited

U.S. PATENT DOCUMENTS

| | | | |
|---|---|---|---|
| 2004/0095736 A1* | 5/2004 | Choi | H01L 25/0657 |
| | | | 361/803 |
| 2005/0002167 A1* | 1/2005 | Hsuan | H01L 25/165 |
| | | | 257/E25.031 |
| 2005/0167830 A1* | 8/2005 | Chang | H05K 3/4007 |
| | | | 257/737 |
| 2005/0195582 A1 | 9/2005 | Landeros et al. | |
| 2008/0217384 A1* | 9/2008 | Jayantha | H01L 23/49838 |
| | | | 228/180.21 |
| 2011/0169157 A1* | 7/2011 | Fan | H01L 23/49838 |
| | | | 257/737 |
| 2015/0145129 A1* | 5/2015 | Chen | H01L 24/16 |
| | | | 257/737 |
| 2021/0111170 A1* | 4/2021 | Elsherbini | H01L 24/83 |

* cited by examiner

ELECTRONIC PACKAGE WITH VARYING INTERCONNECTS

BACKGROUND

The present invention relates to flip chip/controlled collapse chip connection (C4) devices, and more specifically, to providing under bump metallurgy (UBM) geometries which allow for large and dense C4 bump cages to be used in flip-chip devices.

Electrical circuitry in flip-chip devices has continued to decrease in size and increase in complexity, and as a result the number and density of C4 connections between the layers of flip-chip devices also increases. As the density and size of the C4 connection layers between the layers of flip-chip devices increases, necessary underfill material becomes increasingly difficult to disperse through the connection layers.

SUMMARY

One general aspect includes an electronic package. The electronic package includes a device layer, a substrate layer, and an interconnect layer positioned between the device layer and the substrate layer. The interconnect layer includes a plurality of solder bumps arranged within the interconnect layer, where a first subset of the plurality of solder bumps may include a first cross-sectional area, and where the first subset is arranged along a first position at a first edge of the interconnect layer. The interconnect layer also includes a second subset of the plurality of solder bumps may include a second cross-sectional area, where the second subset is arranged at a second position of the interconnect layer, and a third subset of the plurality of solder bumps is arranged between the first position and the second position, where the third subset may include a plurality of cross-sectional areas.

One example embodiment include an interconnect layer for an electronic a plurality of solder bumps arranged within the interconnect layer. The interconnect layer includes a first subset of the plurality of solder bumps which may include a first cross-sectional area, where the first subset is arranged along a first position at a first edge of the interconnect layer. The interconnect layer may also include second subset of the plurality of solder bumps including a second cross-sectional area, where the second subset is arranged at a second position of the interconnect layer, and where a plurality of cross-sectional areas for the plurality of solder bumps decreases along an underfill flow direction from the first position to the second position.

One example embodiment is a method for fabrication. The method includes, during a first plating process, forming a first plurality of C4 pillars on a first structure, where the first plurality of C4 pillars may include a plurality of cross-sectional areas, where the plurality of cross-sectional areas decrease along an underfill flow direction between a first subset of the first plurality of C4 pillars to a second subset of the first plurality of C4 pillars. The method also includes, during a during a second plating process, forming a plurality of solder plates on the C4 pillars, where each solder plate of the plurality of solder plates may include a mass of solder corresponding to a cross-sectional area of a respective C4 pillar on which the solder plate is formed, where the mass of solder provides for a may include interconnect height upon solder reflow, and during a finishing process, forming a plurality of solder bump interconnects between the first plurality of C4 pillars on the first structure and a second plurality of C4 pillars on a second structure. Other embodiments of this aspect include corresponding computer systems, apparatus, and computer programs recorded on one or more computer storage devices, each configured to perform the actions of the methods.

DETAILED DESCRIPTION

Flip chip/controlled collapse chip connection (C4) devices include under bump metallurgy (UBM) such as C4 solder bumps between various layers of the flip-chip device/package. In order to provide both mechanical protection and electrical/signal insulation, flip-chip devices include an underfill material between the solder bumps in interconnect layers. In some examples, underfill material includes a high-modulus (7-13 GPa) epoxy with 1-10 um size silica fillers. The underfill material is typically dispersed or caused to flow through interconnect layers of flip-chip devices once the interconnect layer is assembled (i.e., solder bumps are in place). As the size density and size of interconnect layers increases, the physical properties of the underfill material and manufacturing restraints in fabrication flip-chip devices limits the effective dispersion of the underfill material and in turn the size of interconnect layers.

The electronic packages, interconnect layers, and methods described herein provide for solder bumps arranged in an interconnect layer where various subsets of solder bumps have varying cross-sectional areas. The cross-sectional areas of the solder bumps decrease along an underfill flow direction in the interconnect layer, which allows for underfill material to more quickly fill large and dense interconnect layers within manufacturability limits.

Figure 1A:
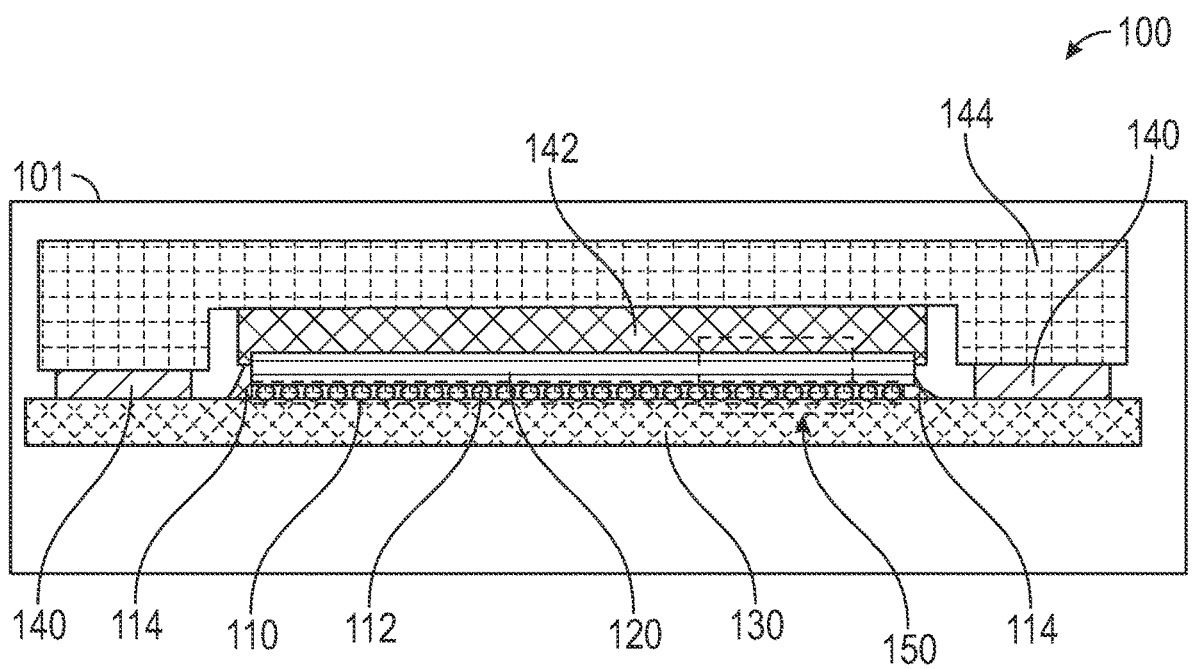
FIGS. 1A-B illustrate an electronic package, according to embodiments described herein.

FIG. 1A illustrates an electronic package, package 100, according to embodiments described herein. The electronic packages described herein, including the package 100, may be embodied as an integrated circuit (IC), semiconductor device, flip chip, etc. FIG. 1A includes cross-section view 101 of the package 100, the cross-section view 101 is a cross-sectional side edge view of the package 100. The package 100 includes a laminate or substrate layer 130. While shown as a laminate/substrate layer, the substrate layer 130 may include any type of structure or substrate used in a C4 electronic package (e.g., a circuit board, chip mount, etc.).

In some examples, the package 100 also includes a lid 144 mounted to the substrate layer 130 via lid mounts 140. The lid mounts 140 may include an adhesive or other connection means to secure the lid 144 to the substrate layer 130. In some example embodiments, the lid 144 protects electronic components or chips in a device layer 120 from mechanical interactions. Additionally, the lid may also be thermally coupled to the device layer 120 via a thermal interface material (TIM) layer 142 in order to provide heat dissipation to heat producing electronic components in the device layer 120.

The device layer 120 may include one or more chips (microchips) or other electronic components for the package 100. The device layer 120 is mounted on the substrate layer 130 via an interconnect layer 110, where the interconnect layer 110 also electronically couples the device layer 120 to the substrate layer 130. In some examples, the interconnect layer includes a plurality of C4 interconnects. The C4 interconnects may include a plurality of solder bumps 112, which provide electrical connections from one or more connection points in the device layer 120 to one or more connection points in the substrate layer 130 as described in more detail in relation to FIG. 1B. In the cross-section view 101 of FIG. 1A, the plurality of solder bumps 112 have a same or similar diameter for ease of illustration. In some examples, the plurality of solder bumps 112 shown in the cross-section view 101 have varying diameters as described in more detail in the embodiments herein.

In some examples, the interconnect layer 110 includes a plurality of solder bumps arranged in C4 cages (herein referred to as arrangements), including hexagonal distributions, orthogonal distribution, or a combination of distributions. To provide both mechanical and electrical protection to the plurality of solder bumps in the package 100, the interconnect layer 110 also includes an underfill material 114. The underfill material may include a dielectric adhesive or other material that provides electrical insulation as well as mechanical support in the interconnect layer 110. The solder bumps and underfill of the package 100 as shown in more detail in FIG. 1B.

Figure 1B:
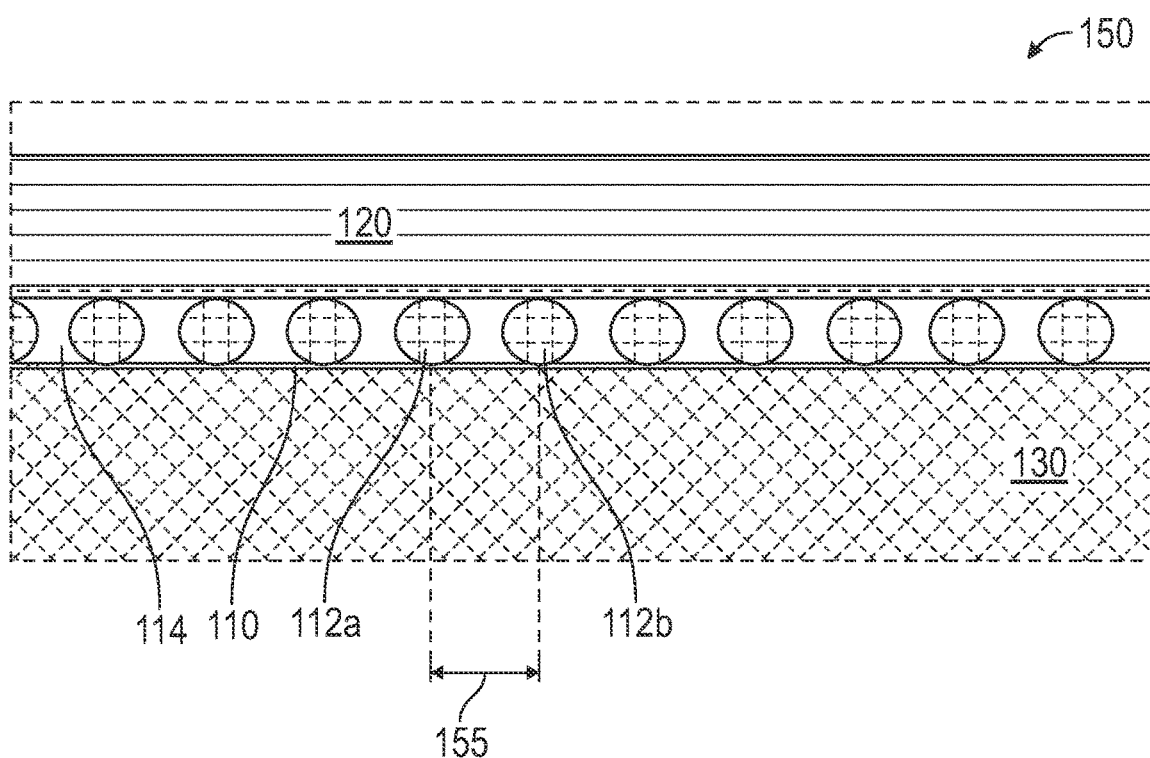

FIG. 1B illustrates a partial view 150 of an edge of the package 100, according to embodiments described herein. The interconnect layer 110 includes the solder bumps 112a and 112b between the device layer 120 and the substrate layer 130. The solder bumps 112a and 112b are arranged with a pitch 155. As electronic package density and processing power increases, the pitch between interconnects (e.g., the solder bumps) in the interconnect layer 110 decreases. For example, the pitch for large processors has decreased from 185 microns (um) to 150 um to 130 um. Similarly, high-bandwidth memory chips routinely have pitches close to 55 um with pitches varying from 10-20 um etc. in development for future flip-chip devices/packages.

The smaller pitches in the electronic packages increases an amount of time that required for the underfill material to completely fill the interconnect layer (e.g., C4 cage, etc.). In some cases, large electronic packages with small pitch values increases the time required beyond manufacturability limits for the underfill material. As described herein, the package 100 includes interconnects, such as solder bumps 112a and 112b with varying diameters in order to decrease a time required for the underfill material 114 to flow throughout the interconnect layer 110 with very small pitch values for the pitch 155. Example arrangements of the plurality of solder bumps with varying diameters is described in more detail in relation to FIGS. 2A-6.

Figure 2A:
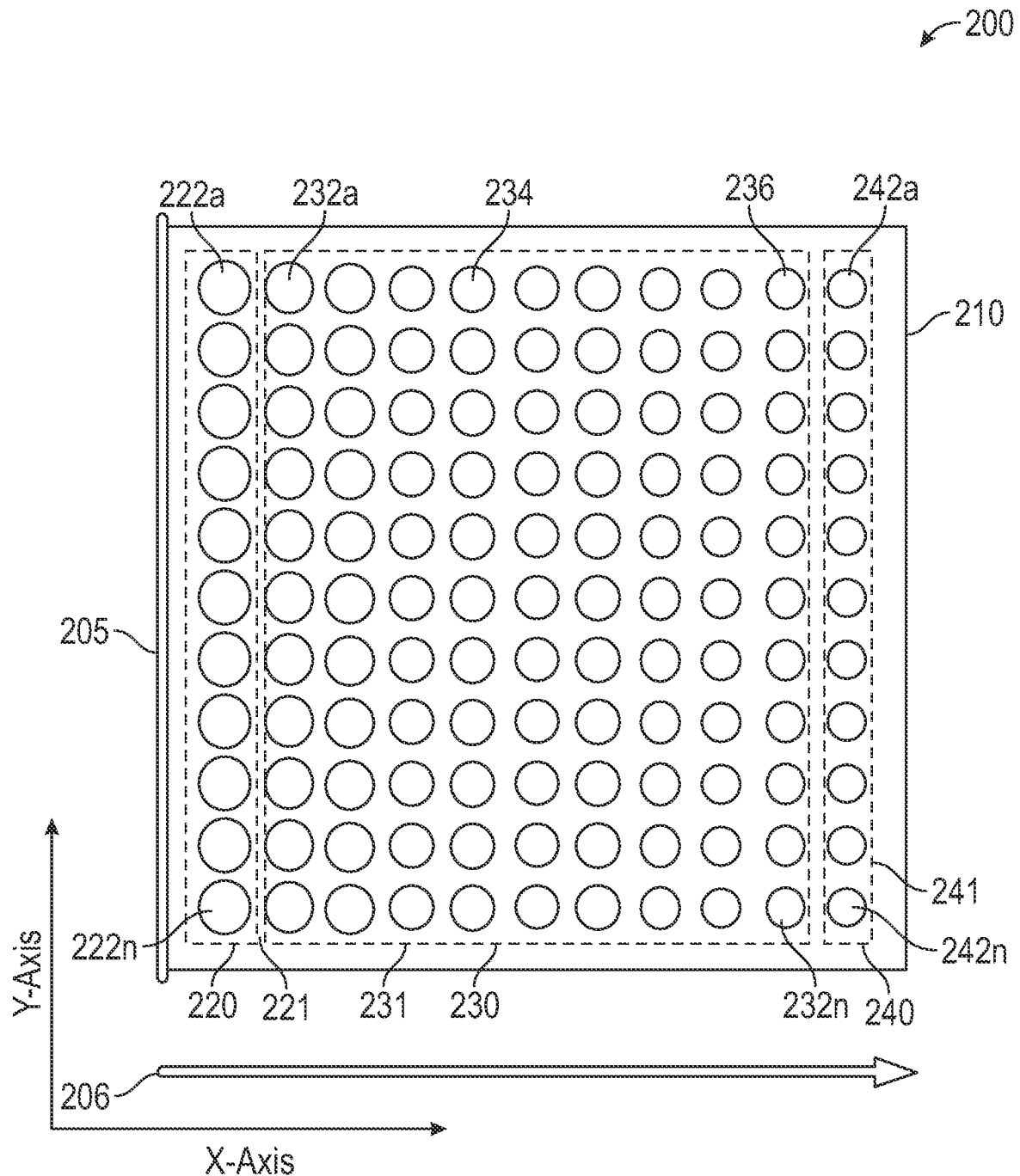
FIGS. 2A-B illustrate top views of a plurality of C4 solder bumps arranged in an interconnect layer, according to embodiments described herein.

FIG. 2A illustrates a top view 200 of a plurality of solder bumps arranged in an interconnect layer, according to embodiments described herein. In some examples, the package 100 described in FIG. 1A includes the plurality of solder bumps 112 in an arrangement 210 in the interconnect layer 110. The package 100 may also include an underfill dispense edge 205, where underfill material is dispensed into the interconnect layer 110 and the arrangement 210 during a manufacture/assembly process for the package 100. For example, at a point after the device layer 120 and the substrate layer 130 are coupled via the interconnect layer 110, the underfill material 114 is dispensed into the arrangement 210 at the dispense edge 205. The underfill material 114 flows along an underfill flow direction 206 into and throughout the arrangement 210.

In some examples, to increase the flow rate for the underfill material 114 through the arrangement 210, the plurality of solder bumps in the arrangement 210 have varying solder bump or interconnect diameters. For example, the arrangement 210 includes a first subset 220, a second subset 240, and a third subset 230 of the plurality of solder bumps 112 in the arrangement 210. In some examples, a pitch (e.g., the pitch 155 shown in FIG. 1B) between the solder bumps in each of the subsets is the same (i.e., the pitch between solder bumps in the first subset 220 is a same pitch for the solder bumps in the second subset 240 and the third subset 230). In some examples, while a pitch between the solder bumps is standard in the arrangement 210, a diameter of the solder bumps changes along the underfill flow direction 206.

For example, as shown in FIG. 2A, the underfill flow direction 206 flows in the X-Axis direction from the underfill dispense edge 205 to an interior of the arrangement 210 (e.g., an interior section of the package 100). In this example, the diameters of solder bumps closer to the dispense edge 205 are relatively larger than the diameters of solder bumps further away from the dispense edge along the X-Axis. For example, the first subset 220 is in a first position 221 in the arrangement 210, where the first position 221 is adjacent to the dispense edge 205. The solder bumps in the first subset 220, including solder bumps 222a-222n have a first cross-sectional area, where the first cross-sectional is uniform or nearly uniform across the subset. For example, the cross-sectional area of the solder bumps does not change in the first subset 220 for each solder bump between the solder bump 222a and the solder bump 222n along the Y-axis.

Additionally, the second subset 240 is in a second position 241 in the arrangement 210. In some examples, the second position 241 is a furthest position from the dispense edge 205 in the arrangement 210 (e.g., the solder bumps in the second subset 240 are further from the dispense edge 205 than any other solder bumps in the arrangement 210). In some examples, the solder bumps in the second subset 240, including solder bumps 242a-242n have a second cross-sectional area, where the second cross-sectional is uniform or nearly uniform across the subset. For example, the cross-sectional area of the solder bumps does not change in the second subset 240 for each solder bump between the solder bump 242a and the solder bump 242n along the Y-axis. In some examples, the second cross-sectional area is the smallest of the cross-sectional areas for solder bumps in the arrangement 210.

In some examples, the third subset 230 is at a third position 231 between the first position 221 and the second position 241 where the third subset 230 includes solder bumps 232a-232n arranged in the third position 231. In some examples, the third position 231 includes the area in the arrangement 210 between the closest position and the furthest position from the dispense edge 205 in the arrangement 210. In some examples, the solder bumps 232a-232n have a plurality of varying cross-sectional areas. For example, the cross-sectional areas of the solder bumps change in the third subset 230 for each solder bump between the solder bump 232a and the solder bump 232n along the X-axis. For example, a cross-sectional area of the solder bump 234 is larger than the cross-sectional area of a solder bump 236.

In some examples, the difference in the first-cross-section area of the first subset and the second cross-sectional area of the second subset along with the varying cross-sectional areas of the third subset 230 creates a capillary action in the arrangement 210, such that as underfill material 114 is dispensed at the dispense edge 205, the geometry of the cross-sectional areas of the first second and third subset causes the underfill material 114 to flow into arrangement 210 at a faster speed than a traditional C4 cage. This in turn reduces the time for the underfill to flow throughout the interconnect layer 110 and allows for smaller pitches between solder bumps in large electronic packages. While shown with one dispense edge (e.g., dispense edge 205) in arrangement 210, the package 100 may include multiple dispense edges in the interconnect layer, as shown in FIG. 2B.

Figure 2B:
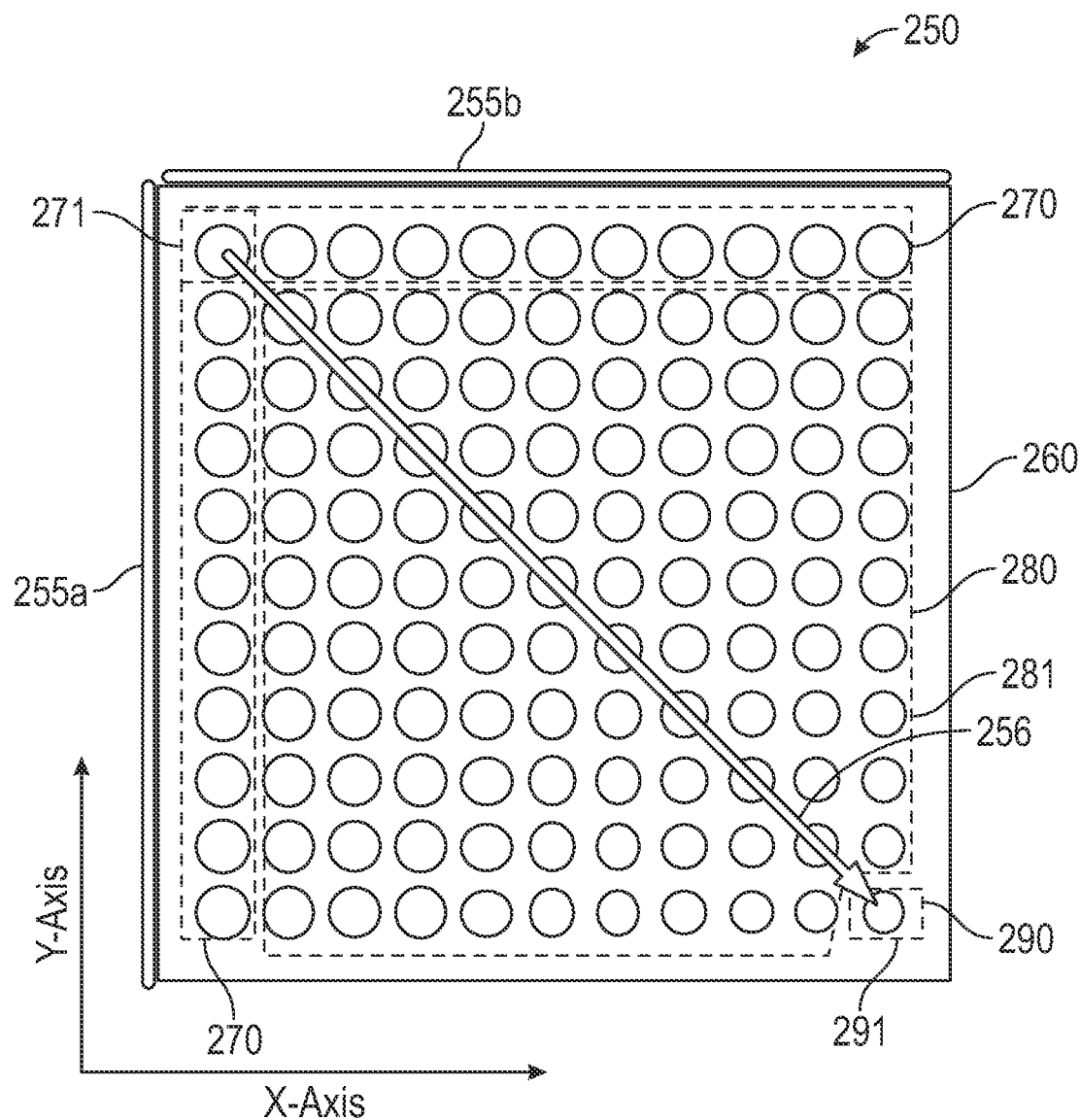

FIG. 2B illustrates a top view 250 of a plurality of solder bumps arranged in an interconnect layer, according to embodiments described herein. In some examples, the package 100 described in FIG. 1A includes the plurality of solder bumps 112 in an arrangement 260. The package 100 may also include underfill dispense edges 255a and 255b, where underfill material is dispensed into the interconnect layer 110 along the dispense edges 255a and 255b. In some examples, the underfill material 114 flows along an underfill flow direction 256 into the arrangement 210, where the flow direction is along both the X-Axis and Y-Axis.

To increase the flow rate for the underfill material 114 through the arrangement 260, the plurality of solder bumps in the arrangement 260 have varying solder bump or interconnect diameters. For example, the arrangement 260 includes a first subset 270, a second subset 290, and a third subset 280 of the plurality of solder bumps in the arrangement 260. In some examples, the pitch between the solder bumps in each of the subsets is the same (i.e., the pitch between solder bumps in the first subset 270 is a same pitch for the solder bumps in the second subset 290 and the third subset 280). In some examples, while a pitch between the solder bumps is standard in the arrangement 260, a diameter of the solder bumps changes along the underfill flow direction 256.

For example, as shown in FIG. 2B, the underfill flow direction 256 flows in both the X-Axis and Y-Axis directions from the underfill dispense edges 255a and 255b to an interior of the arrangement 260 (e.g., an interior section of the package 100). In this example, the diameters of solder bumps closer to the dispense edges 255a and 255b are relatively larger than the diameters of solder bumps further away from the dispense edges along the X-Axis and the Y axis. For example, the first subset 270 is in a first position 271 in the arrangement 260, where the first position 271 is adjacent to the dispense edges 255a and 255b. The solder bumps in the first subset 270, have a first cross-sectional area, where the first cross-sectional is uniform or nearly uniform across the subset.

Additionally, the second subset 290 is in a second position 291 in the arrangement 260. In some examples, the second position 291 is a furthest position from the dispense edges 255a-b in the arrangement 260 (e.g., the solder bump(s) in the second subset 290 are further from the dispense edges 255a and 255b than any other solder bumps in the arrangement 260). In some examples, the solder bump(s) in the second subset 290 have a second cross-sectional area, where the second cross-sectional is uniform or nearly uniform across the subset. In some examples, the second cross-sectional area is the smallest of the cross-sectional areas for solder bumps in the arrangement 260.

In some examples, the third subset 280 is at a third position 281 between the first position 271 and the second position 291. In some examples, the third position 281 includes an area in the arrangement 260 between the closest position and the furthest position from the dispense edges 255a and 255b in the arrangement 260. In some examples, the solder bumps in the third subset 280 have a plurality of varying cross-sectional areas. For example, the cross-sectional areas of the solder bumps change in the third subset 280 for each solder bump along the X-axis and the Y-axis and along the underfill flow direction 256.

In some examples, the difference in the first-cross-section area of the first subset 270 and the second cross-sectional area of the second subset 290 along with the varying cross-sectional areas of the third subset 280 creates a capillary action in the arrangement 260, such that as underfill material 114 is dispensed at the dispense edges 255a and 255b, the geometry of the cross-sectional areas of the first, second, and third subsets causes the underfill material 114 to flow into and throughout the arrangement 260.

The cross-sectional areas described above in relation to FIGS. 2A and 2B are described as reducing in size along the respective underfill flow directions. In some examples, the cross-sectional areas of the solder-bumps may also change in both size and shape as described in more detail in relation to FIGS. 3A-3C.

Figure 3A:
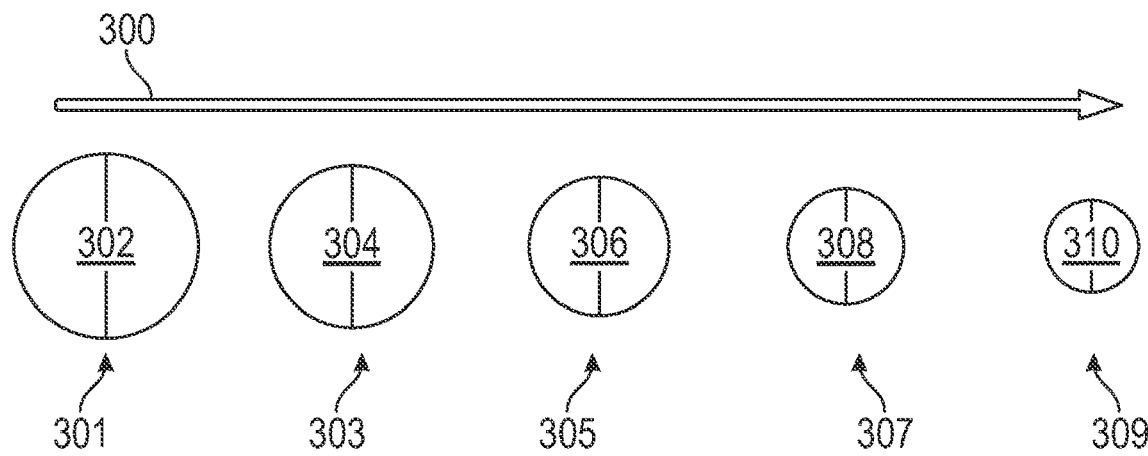
FIG. 3A-3C illustrate decreasing cross-sectional areas of a plurality of C4 solder bumps, according to embodiments described herein.
Figure 3B:
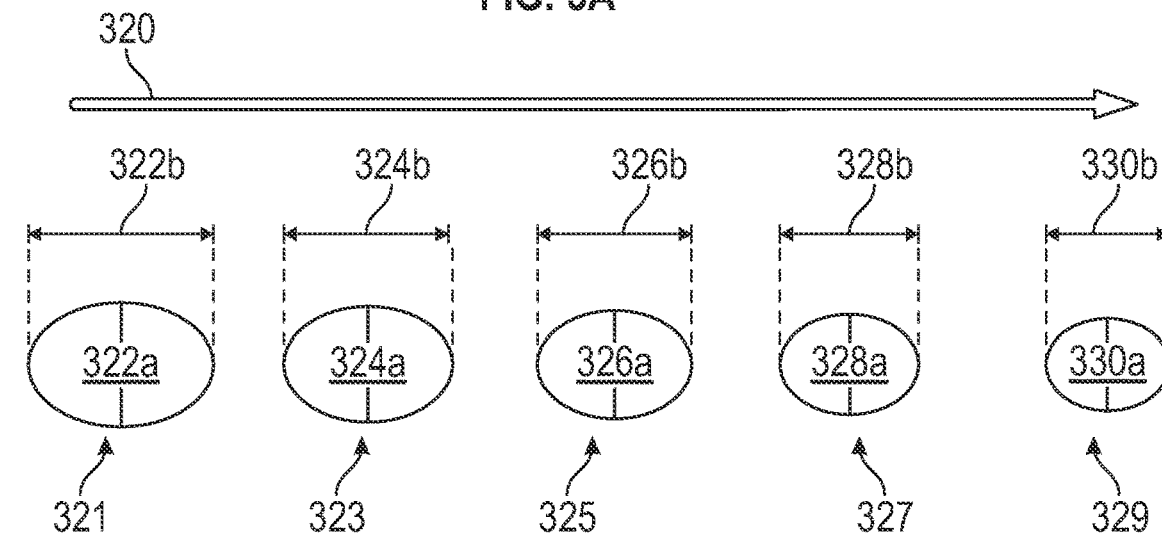
Figure 3C:
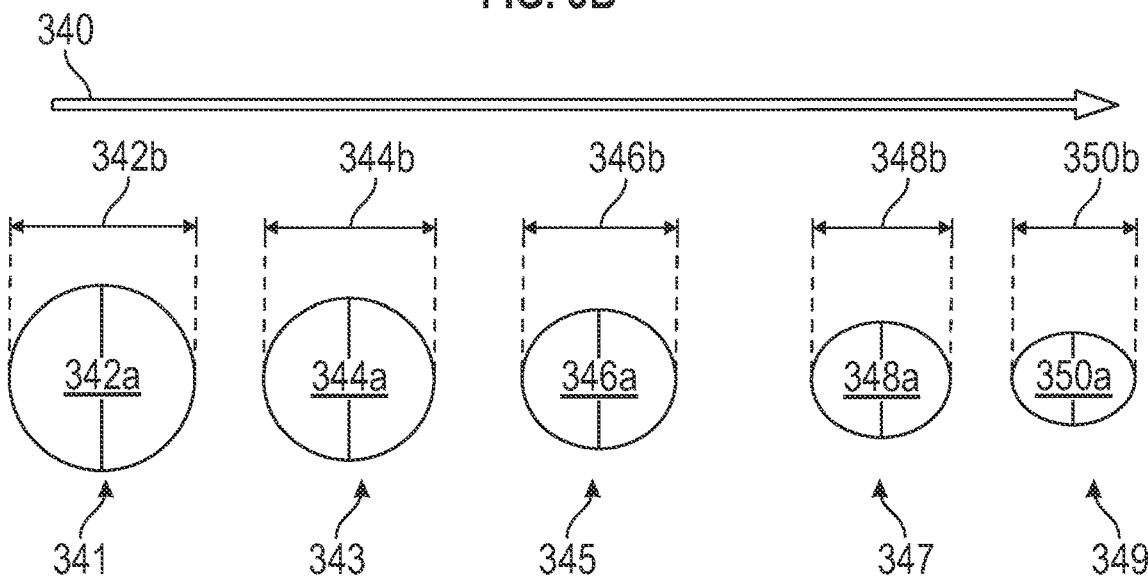

FIG. 3A-3C illustrates decreasing cross-sectional areas of a plurality of solder bumps, according to embodiments described herein. The solder bumps described in FIGS. 3A-3C may be used in any of the solder bump arrangements described herein including the arrangements shown in FIGS. 2A-B as well as the arrangements descried in relation to 4A-6.

FIG. 3A illustrates solder bumps 301-309. In some examples, the solder bump 301 is an example solder bump from a first subset in an arrangement of solder bumps (e.g., first subset 220 in FIG. 2A), solder bump 309 is an example solder bump from a second subset (e.g., second subset 240 in FIG. 2A), and solder bumps 303, 305, and 307 are example solder bumps from a third subset (e.g., third subset 230). In some examples, the cross-sectional areas of the solder bumps 301-309 include a circular shape and the areas decrease along underfill flow direction 300 (e.g., underfill flow direction 206). For example, diameter 302 of solder bump 301 is larger diameter 304, which in turn is larger than diameter 306, 308, 310 and so on. In this example, the diameter 310 is the smallest diameter of the diameters 302-310 and diameter 302 is the largest diameter. In some example, the change between the diameters of the solder bumps 301-309 is monotonic along the underfill flow direction 300).

FIG. 3B illustrates solder bumps 321-239. In some examples, the solder bump 321 is an example solder bump from a first subset in an arrangement of solder bumps (e.g., first subset 220 in FIG. 2A), solder bump 329 is an example solder bump from a second subset (e.g., second subset 240 in FIG. 2A), and solder bumps 323, 325, and 327 are example solder bumps from a third subset (e.g., third subset 230). In some examples, the cross-sectional areas of the solder bumps 321-329 include an elliptical shape and the areas decrease along underfill flow direction 320 (e.g., underfill flow direction 206). For example, width 322a and length 322b of solder bump 321 are larger than the width 324a and length 324b, etc. In this example, the width 330a and length 330b provide the smallest cross-sectional areas for the solder bumps 321-329. In some examples, the change between the areas of the solder bumps 321-329 is monotonic along the underfill flow direction 320.

FIG. 3C illustrates solder bumps 341-349. In some examples, the solder bump 341 is an example solder bump from a first subset in an arrangement of solder bumps (e.g., first subset 220 in FIG. 2A), solder bump 349 is an example solder bump from a second subset (e.g., second subset 240 in FIG. 2A), and solder bumps 343, 345, and 347 are example solder bumps from a third subset (e.g., third subset 230). In some examples, the cross-sectional areas of the solder bump 314 is a circulate shape, while cross-section areas of solder bumps 341-349 include varying elliptical shapes. In this example, the cross-sectional shape of the solder bumps is more elliptical and less circular along the underfill flow direction 340. Additionally, the cross-sectional areas also decrease along the underfill flow direction 340 (e.g., underfill flow direction 206). For example, width 342a and length 342b of solder bump 341 are larger than the width 344a and length 344b, etc. In this example, the width 350a and length 350b provide the smallest cross-sectional areas for the solder bumps 341-349. In some examples, the change between the areas of the solder bumps 341-349 is monotonic along the underfill flow direction 340.

In the examples described in FIGS. 2A-B and FIGS. 3A-C, the various arrangements of the solder bumps include one flow direction. In some examples, the underfill may be provided in an interconnect layer in at least two directions as discussed in the arrangements described in FIGS. 4A-C, 5A-B, and 6.

Figure 4A:
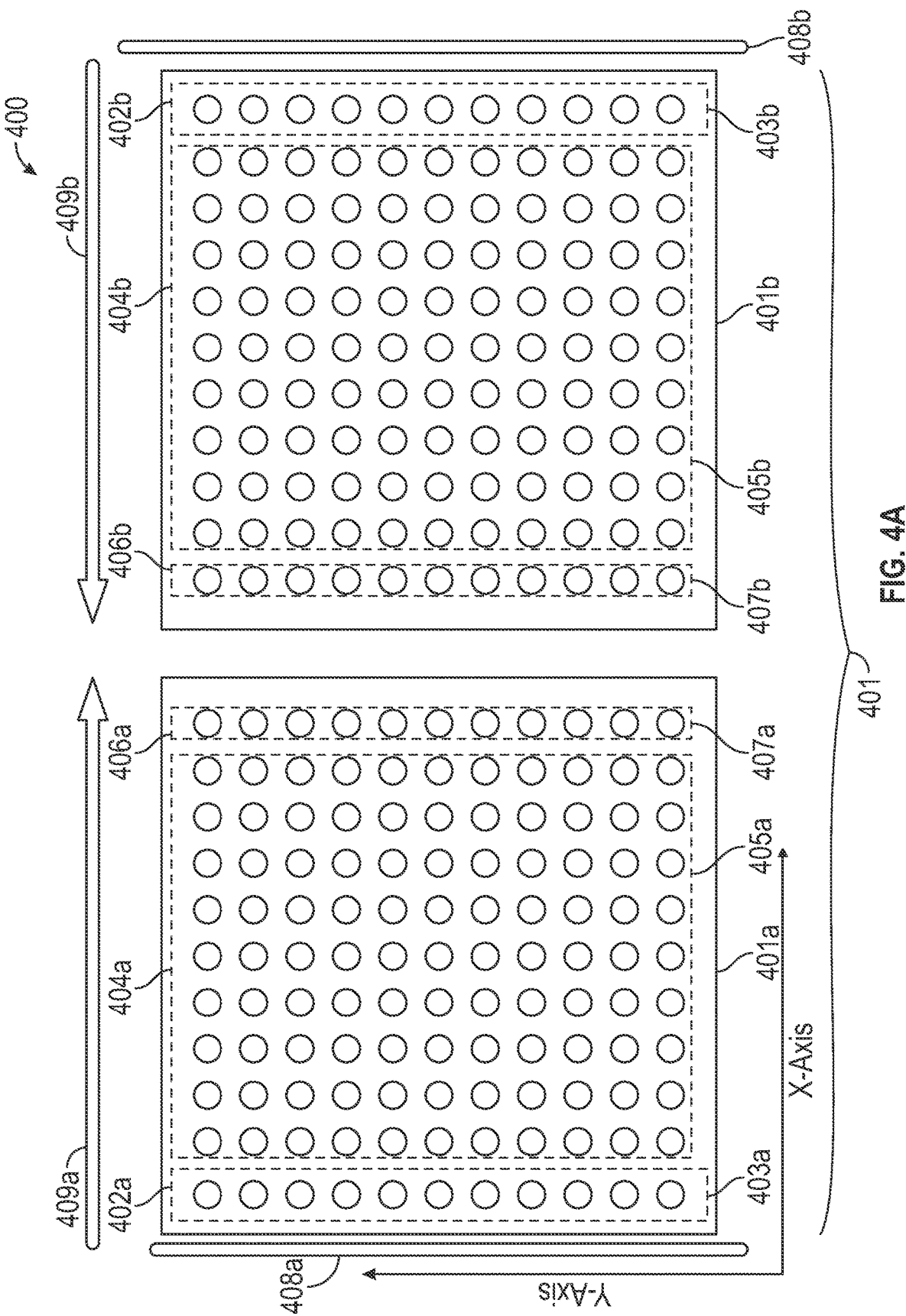
FIGS. 4A-C illustrate top views of a plurality of C4 solder bumps arranged in an interconnect layer of a dual chip module, according to embodiments described herein.

FIG. 4A illustrates a top view 400 of a plurality of solder bumps arranged in an interconnect layer of a dual chip module, according to embodiments described herein. In some examples, the package 100 described in FIG. 1A includes the plurality of solder bumps 112 in an arrangement 401 in the interconnect layer 110. The package 100 may also include underfill dispense edges 408a and 408b on opposite ends of the arrangement 401. The underfill material is dispensed into the interconnect layer 110 and the arrangement 401 during a manufacture/assembly process for the package 100 from both the dispense edges 408a and 408b. For example, at a point after the device layer 120 and the substrate layer 130 are coupled via the interconnect layer 110, the underfill material 114 is dispensed into the arrangement 401 at the dispense edges 408a and 408b. In the arrangement 401, the underfill material 114 flows along both underfill flow direction 409a and 409b into and throughout the arrangement 401.

In some examples, to increase the flow rate for the underfill material 114 through the arrangement 401, the plurality of solder bumps in the arrangement 401 have varying solder bump or interconnect diameters. In some examples, the arrangement 401 has sub-arrangements 401a and 401b. In some examples, the sub-arrangements 401a and 401b are each arrangements similar to the arrangement 210 described in relation to FIG. 2A. Each sub-arrangement 401a and 401b includes a respective first subset, such as first subset 403a and 403b, a respective second subset, such as second subset 407a and 407b, and a respective third subset, such as third subset 405a and third subset 405b. In some examples, a pitch (e.g., the pitch 155 shown in FIG. 1B) between the solder bumps in each of the subsets is the same (i.e., the pitch between solder bumps in the first subset 403a is a same pitch for the solder bumps in the second subset 407a and the third subset 405a). In some examples, while a pitch between the solder bumps standard in the arrangement 401, a diameter of the solder bumps changes along the underfill flow directions 409a and 409b.

For example, as shown in FIG. 4A, the underfill flow directions 409a and 409b in the X-Axis direction from the underfill dispense edges 408a and 408b to an interior of the arrangement (e.g., an interior section of the package 100). In this example, the diameters of solder bumps closer to the dispense edges 408a and 408b are relatively larger than the diameters of solder bumps further away from the dispense edge along the X-Axis. For example, the first subsets 403a and 403a are at positions 402a and 402b, respectively, where the positions 402a and 402b are adjacent to the respective dispense edges 408a and 408b. The solder bumps in the first subset 403a and 403b have a first cross-sectional area, where the first cross-sectional is uniform or nearly uniform across the subset. For example, the cross-sectional area of the solder bumps does not change in the first subsets 403a and 403b along the Y-axis.

Additionally, the second subsets 407a and 407b are in second positions 406a and 406b. In some examples, the second positions 406a and 406b are furthest positions from the dispense edges 408a and 408b in the arrangement 401 (e.g., the solder bumps in the second subsets 407a and 407b are further from the dispense edges 408a and 408b than any other solder bumps in the arrangement 401). In some examples, the solder bumps in the second subsets 407a and 407b, have a second cross-sectional area, where the second cross-sectional is uniform or nearly uniform across the subset. In some examples, the second cross-sectional area is the smallest of the cross-sectional areas for solder bumps in the arrangement 401.

In some examples, the arrangement 401 includes third subsets 405a and 405b are arranged at third positions 404a and 404b between the first positions 403a/403b and the second positions 407a/b. In some examples, the third positions 404a and 404b includes the area in the arrangement 401 between the closest position and the furthest position from the dispense edges 408a/408b. In some examples, the solder bumps in the third subsets 405a and 405b have a plurality of varying cross-sectional areas.

As described above, the difference in the first-cross-section area of the first subsets 403a and 403b and the second cross-sectional area of the second subsets 407a and 407b along with the varying cross-sectional areas of the third subsets 405a and 405b creates a capillary action in the arrangement 210, such that as underfill material 114 is dispended at the dispense edges, the geometry of the cross-sectional areas of the first second and third subset causes the underfill material 114 to flow into the arrangement 401. While shown with one dispense edge on each sub-arrangement 401a and 401b, and on each opposite side of the arrangement 401, the package 100 may include multiple dispense edges in the interconnect layer, as shown in FIG. 4B and 4C.

Figure 4B:
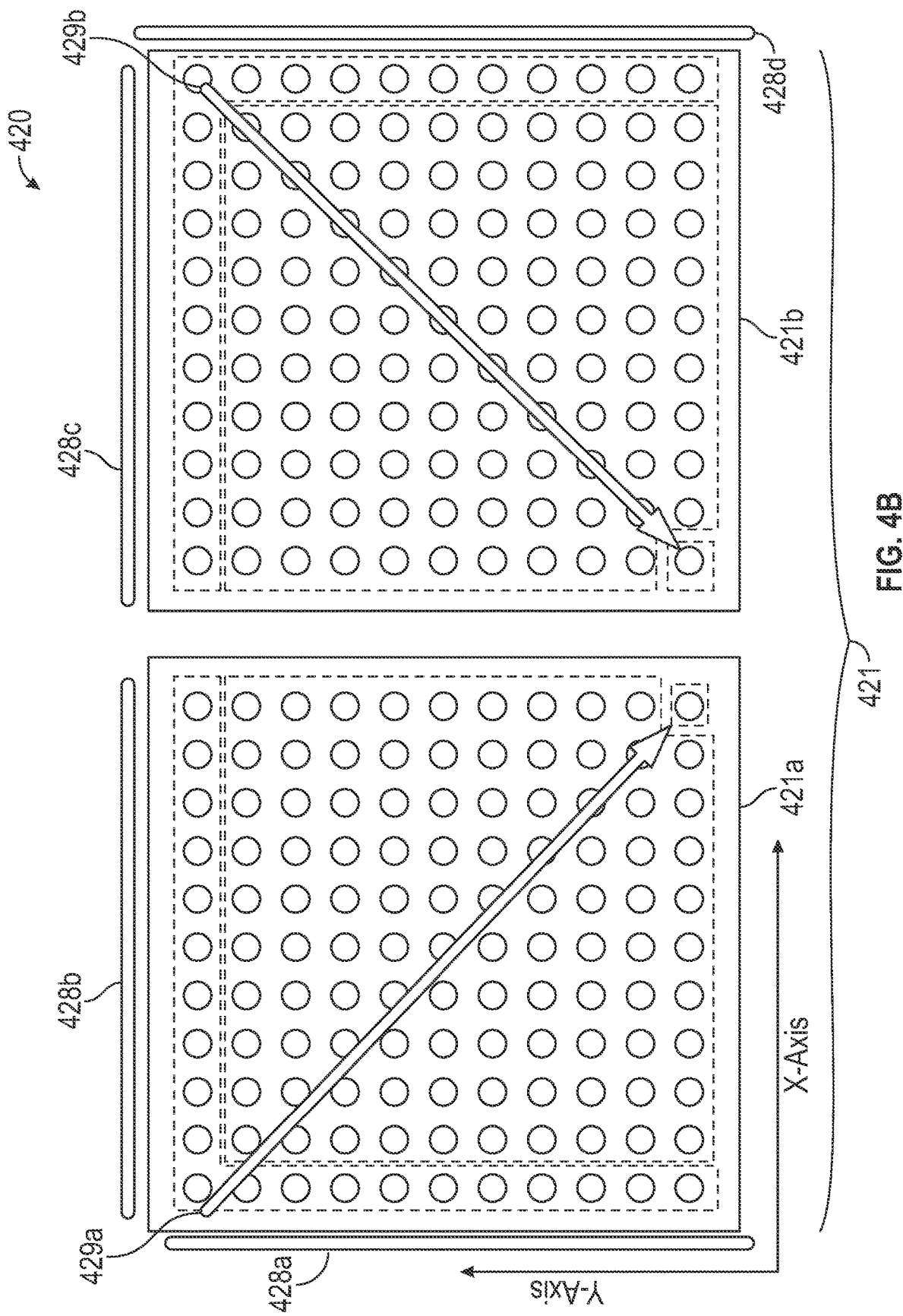
Figure 4C:
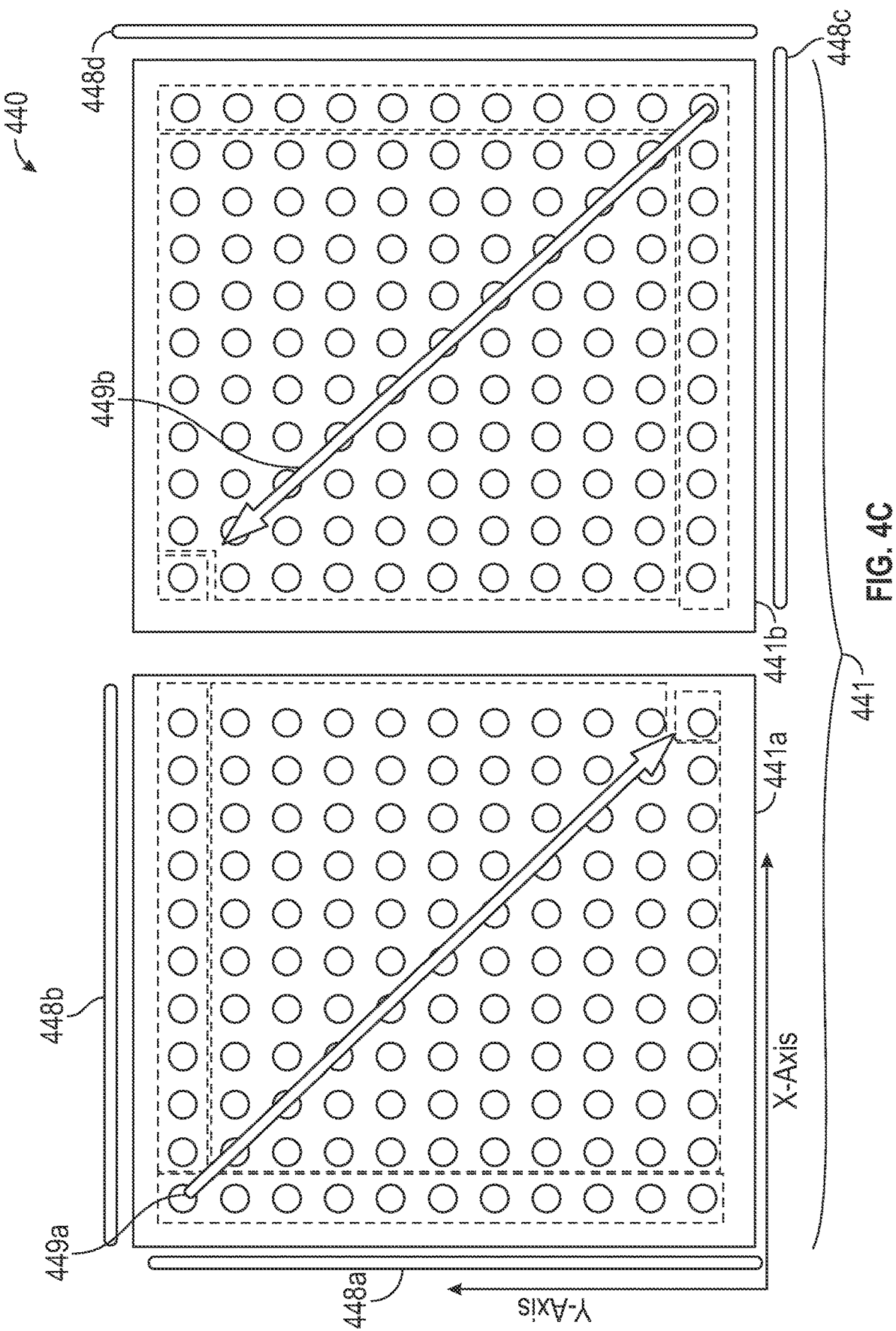

FIGS. 4B and 4C illustrate top views 420 and 440 of a plurality of solder bumps arranged in an interconnect layer, according to embodiments described herein. Arrangement 421 in FIG. 4B and arrangement 441 in FIG. 4C each have sub-arrangements 421a, 421b, 441c, and 441b, respectively. Furthermore, each arrangement includes respective dispense edges 428a-d and 448a-d. The underfill material is dispensed into the interconnect layer 110 at the dispense edges and along the underfill flow directions 429a, 429b, 449a, and 449b.

In some examples, the sub-arrangements 421a and 421 include subsets of solder bumps similar to those described in relation to at least FIGS. 2B and 4A, where the varying sizes of the solder bums in the subsets along the underfill flow directions creates a capillary action in the arrangements 421 and 441, such that as underfill material 114 is dispensed at the respective dispense edges, the geometry of the cross-sectional areas of the first, second, and third subsets in each of the sub-arraignments causes the underfill material 114 to flow into and throughout the arrangements.

Figure 5A:
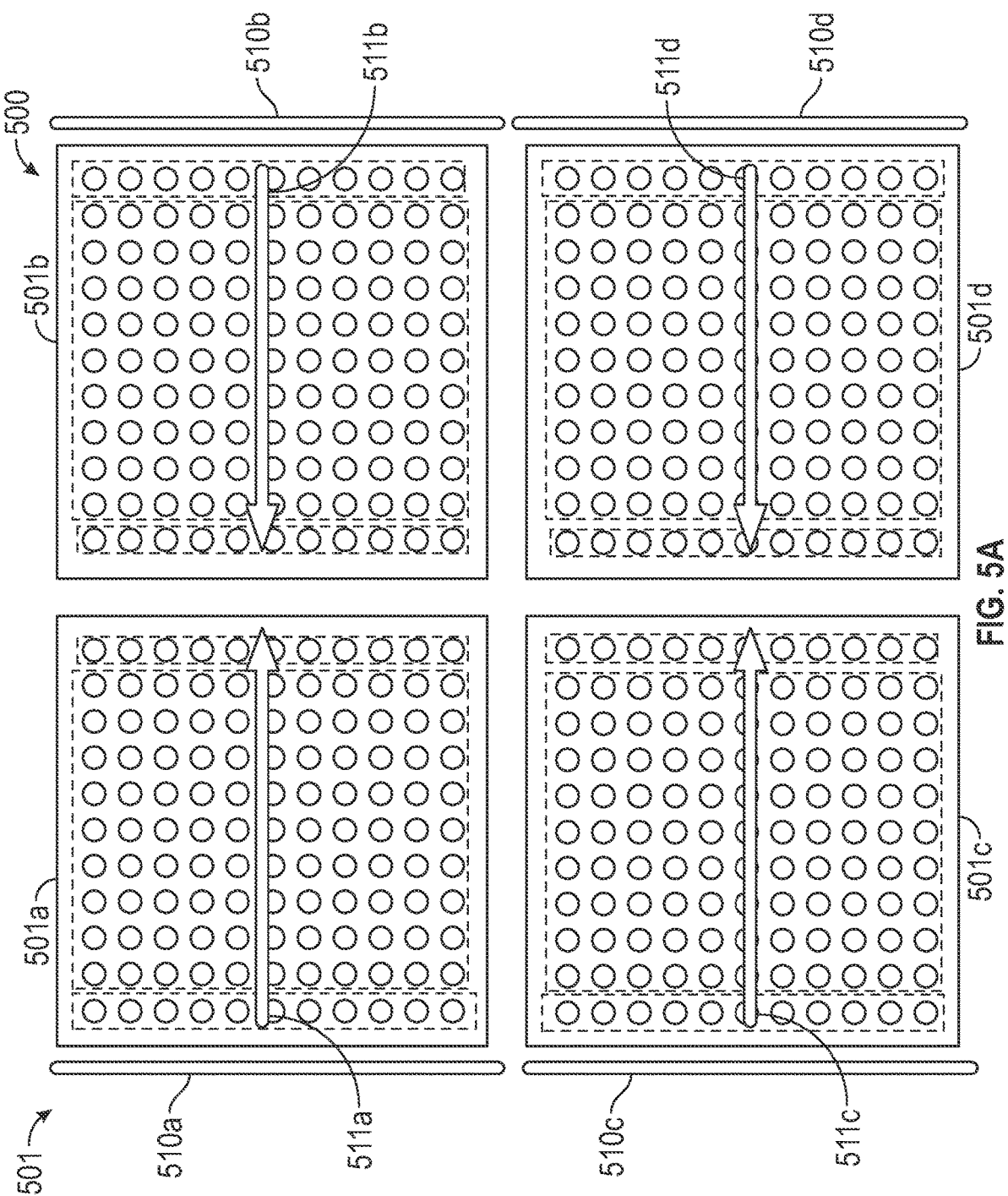
FIGS. 5A-B illustrate top views of a plurality of C4 solder bumps arranged in an interconnect layer of a quad chip module, according to embodiments described herein.
Figure 5B:
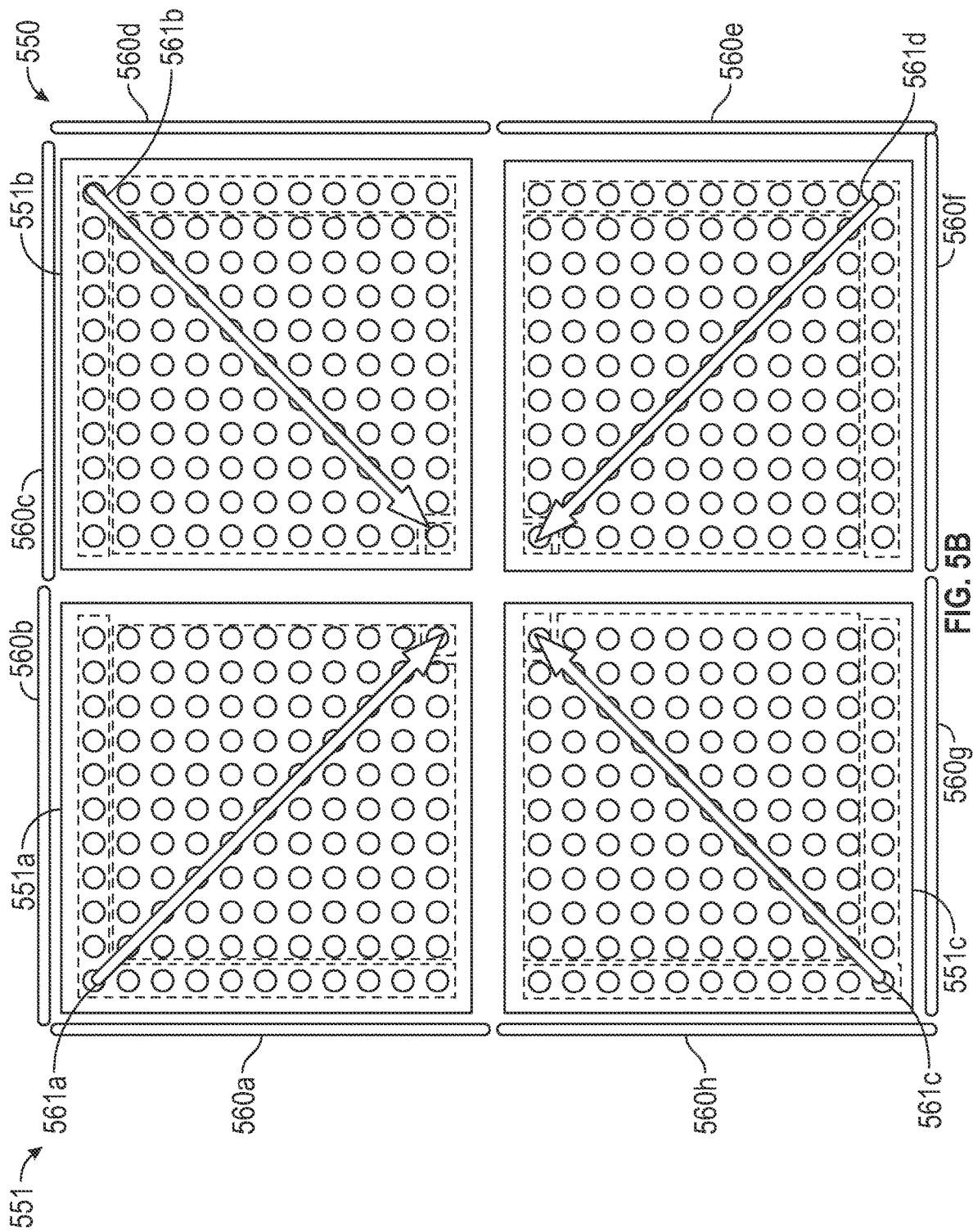

While shown in FIGS. 4A-C with two sub-arrangements of subset of solder bumps, interconnect layers for flip-chip devices may also include three or more sub-arrangements in the interconnect as discussed in relation to FIGS. 5A-B.

FIG. 5A illustrates a top view 500 of a plurality of solder bumps arranged in an interconnect layer of a quad chip module, according to embodiments described herein. In some examples, arrangement 501 has sub-arrangements 501a-501d. In some examples, the sub-arrangements 501a-501d are each arrangements similar to the arrangement 210 and arrangement 401 described in relation to FIGS. 2A and 4A. As described above in relation to FIGS. 2A and 4A, the arrangement 501 includes dispense edges 510a-510d which dispense underfill material, such as underfill material 114, into the arrangement 501 and along the underfill flow directions 511a-511d. In some examples, the arrangement 501 includes sub-arrangements 501a-501d which each include first, second, and third subsets as described in relation to FIGS. 2A and 4A which provide a capillary effect in the arrangement 501 and allow for movement of the underfill material along the underfill flow directions 511a-511d into the interior of the arrangement 501.

FIG. 5B illustrates a top view 550 of a plurality of solder bumps arranged in an interconnect layer of a quad chip module, according to embodiments described herein. In some examples, arrangement 551 includes sub-arrangements 551a-551d. In some examples, the sub-arrangements 551a-551d are each arrangements similar to the arrangement 260 and arrangement 421 described in relation to FIGS. 2B and 4B. As described above in relation to FIGS. 2B and 4B, the arrangement 551 also includes dispense edges 560a-560h which dispense underfill material, such as underfill material 114, into the arrangement 551 and along the underfill flow directions 561a-561d. In some examples, the arrangement 551 includes sub-arrangements 551a-551d which each include first, second, and third subsets as described in relation to FIGS. 2B and 4B which provide a capillary effect in the arrangement 551 and allow for movement of the underfill material along the underfill flow directions 561a-561d into the interior of the arrangement 551.

Figure 6:
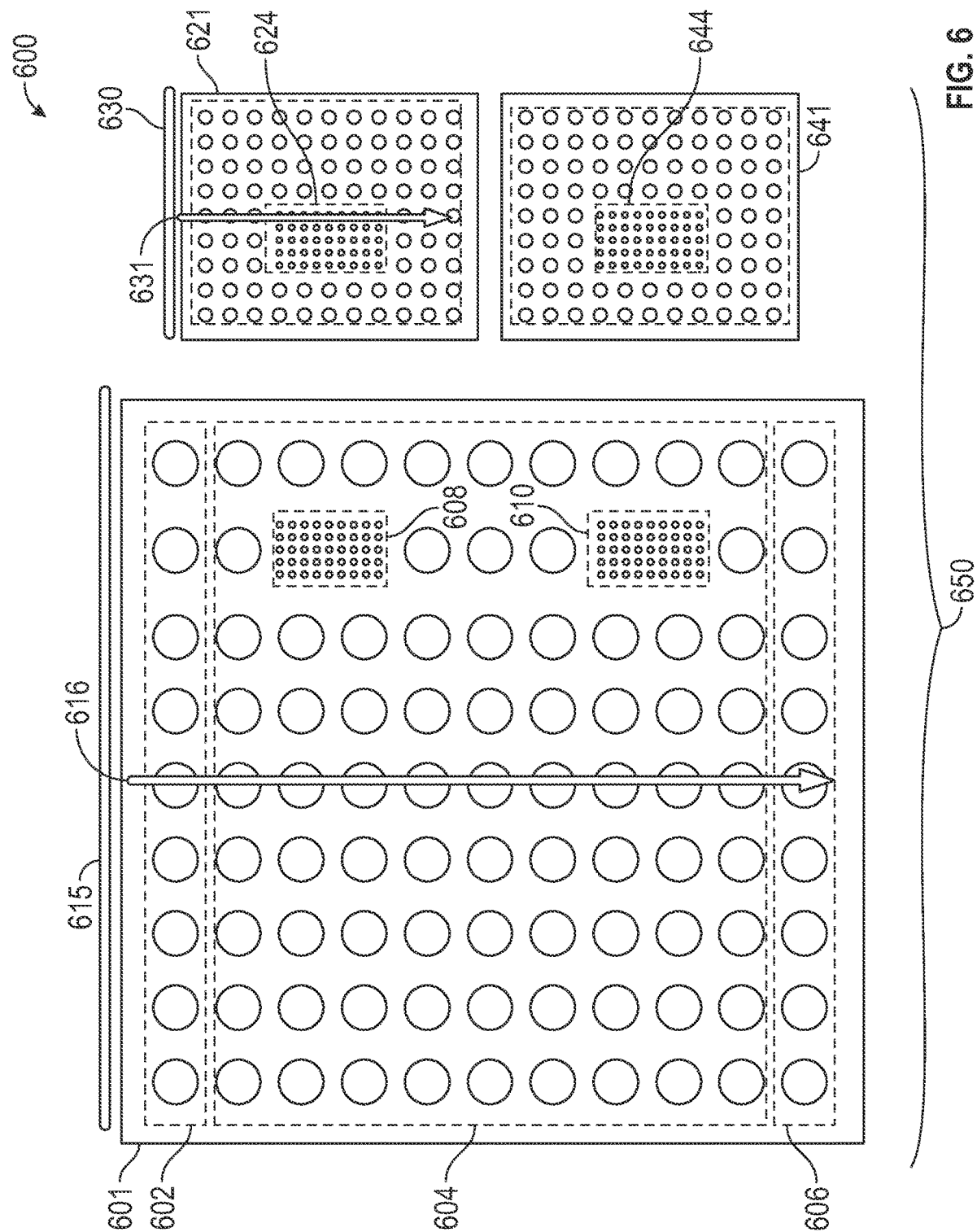
FIG. 6 illustrates a top view of a plurality of C4 solder bumps arranged in an interconnect layer with fine pitched solder bumps, according to embodiments described herein.

FIG. 6 illustrates a top view 600 of a plurality of solder bumps arranged in an interconnect layer with fine pitched solder bumps, according to embodiments described herein. In some examples, arrangement 651 includes sub-arrangements 601, 621, and 641. In some examples, the sub-arrangements 601, 621, and 641 are each arrangements similar to the arrangement 210 and arrangement 401 described in relation to FIGS. 2A and 4A. As described above in relation to FIGS. 2A and 4A, the arrangement 650 also includes dispense edges 615 and 630 which dispense underfill material, such as underfill material 114, into the sub-arrangements 601, 621, and 641 along the underfill flow directions 616 and 631. In some examples, the sub-arrangements 601, 621, and 641 each include first, second, and third subsets as described in relation to FIGS. 2A and 4A. For example, the sub-arrangement 601 includes a first subset 602, a second subset 606, and a third subset 604, where the subset provide a capillary effect in the sub-arrangement 601 and allow for movement of the underfill material along the underfill flow direction 616 into the interior of the arrangement 650.

In some examples, the sub-arrangements include a the fourth subset of the plurality of solder bumps, where the fourth subset includes a plurality of fine cross-sectional areas, where the fine cross-sectional areas have smaller areas than the plurality of solder bumps in surrounding subsets. For example, subsets 608 and 610 have a smaller cross-sectional area than the adjacent solder bumps in the third subset 604. In some examples, subsets 624 and 644 also include smaller cross-sectional areas than the adjacent solder bumps in the sub-arrangements 621 and 641.

Figure 7:
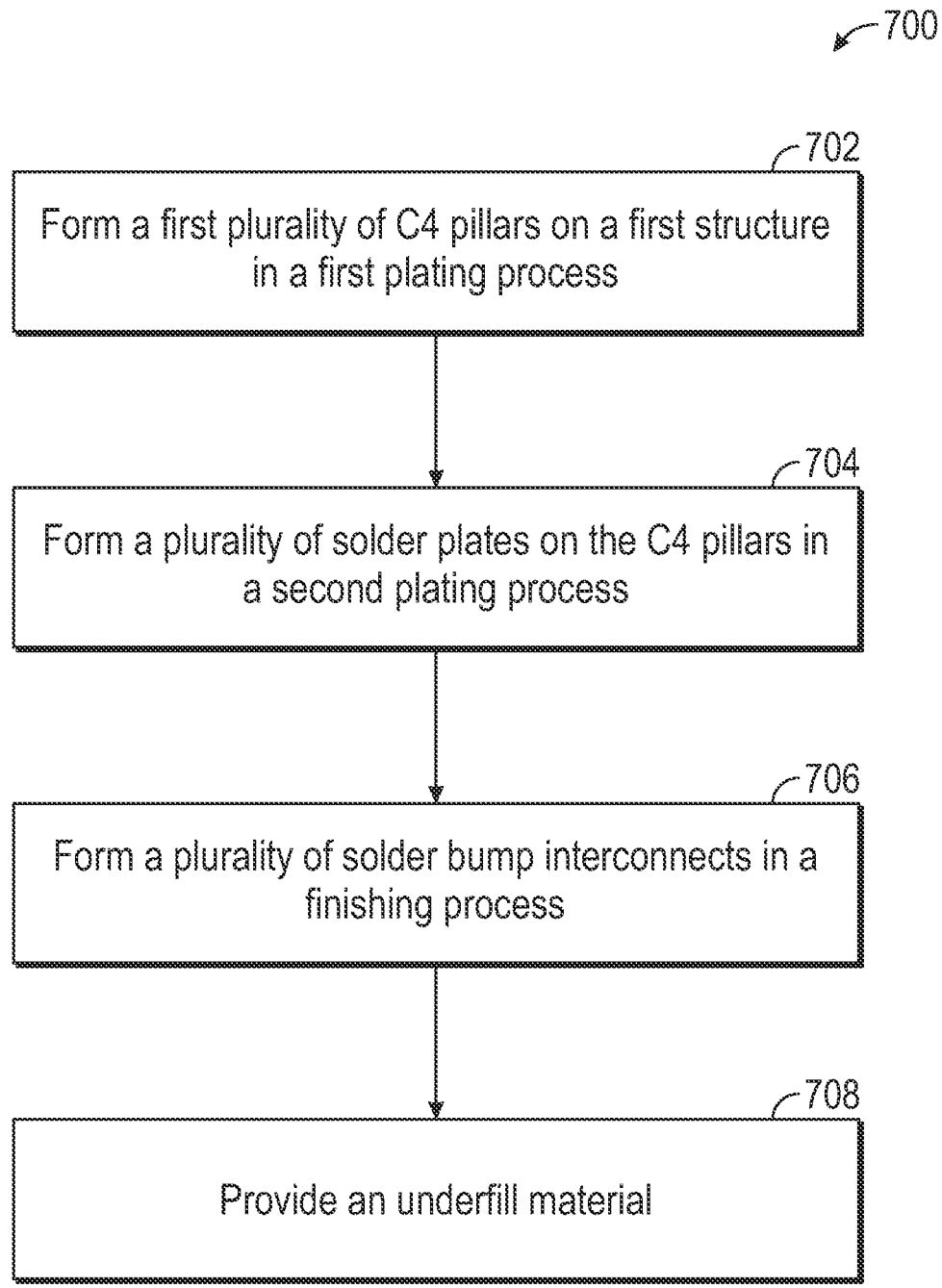
FIG. 7 is a flowchart of a method for fabrication of an interconnect layer, according to embodiments of the present disclosure.

FIG. 7 is a flowchart of a method 700 for fabrication of an interconnect layer, according to embodiments of the present disclosure. Method 700 may be understood in conjunction with FIGS. 8A-G and FIGS. 9A-F, which illustrate a cross-section of the structure during fabrication, according to embodiments of the present disclosure. In some examples, method 700 is a two pass plating process which provides for varying cross-sectional shapes of solder bumps as described in relation to FIGS. 1A-6.

As will be appreciated, because some of the Figures depict in-process fabrication of the interconnect layer, a given figure may include temporary elements that are not included in the final device or have shapes and size of elements that differ from those in the final layout. Similarly, various elements may be absent at various stages of fabrication, and are therefore absent in view that would otherwise include those elements at a later time during fabrication. Additionally, although shown with various sizes, shapes, and quantities of components in the Figures, the elements are provided as non-limiting examples to illustrate potential embodiments of interconnect layers, which may include different sizes, shapes, and quantities of components from those illustrated in the Figures. Furthermore, various elements may be intentionally omitted or resized to better show certain relationships between the other elements.

Method 700 begins at block 702 where a fabricator forms a first plurality of C4 pillars on a first structure during a first plating process. In some examples, the first plurality of C4 pillars includes a plurality of cross-sectional areas, wherein the plurality of cross-sectional areas decrease along an underfill flow direction between a first subset of the first plurality of C4 pillars to a second subset of the first plurality of C4 pillars. In some examples, the first plating process is a photo-resist process.

In some examples, forming the first plurality of C4 pillars includes the steps described in relation to FIGS. 8A-E. For example, as shown in step 800 in FIG. 8A, the fabricator processes a wafer 802 to form a finished wafer surface for the process. In some examples, the wafer 802 may be processed with or without PI. At step 810 in FIG. 8B, the fabricator forms a seed layer 812 on the wafer 802. In some examples, the seed layer is layer for building C4 pillars/ interconnect/contacts during later processes described herein. The seed layer may include a metallic material such as TiWCu.

Figure 8A:
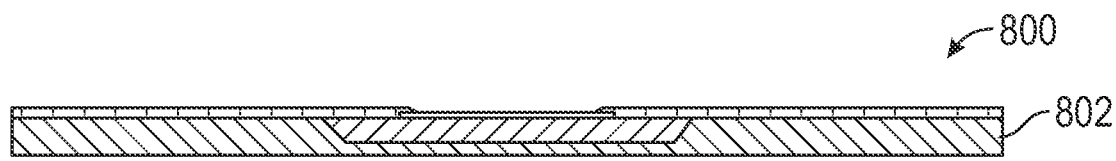
FIGS. 8A-G and FIGS. 9A-G illustrate a cross-section of an interconnect layer during fabrication, according to embodiments of the present disclosure.
Figure 8B:
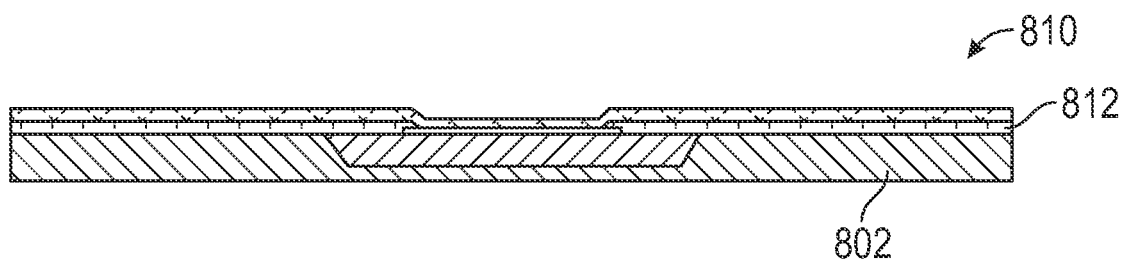
Figure 8C:
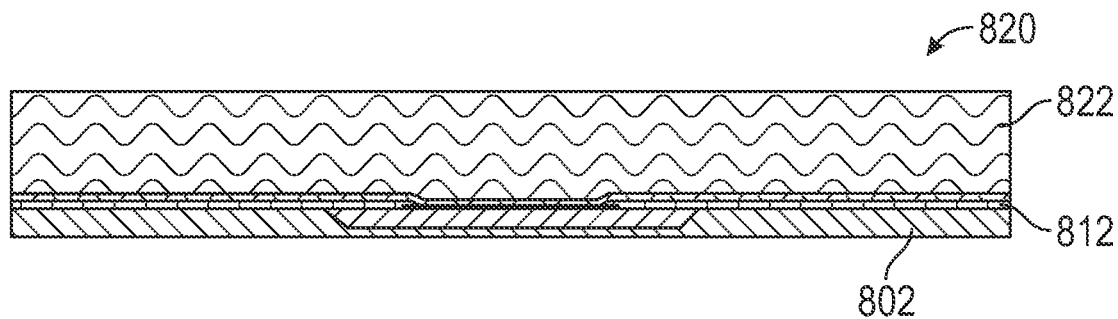
Figure 8D:
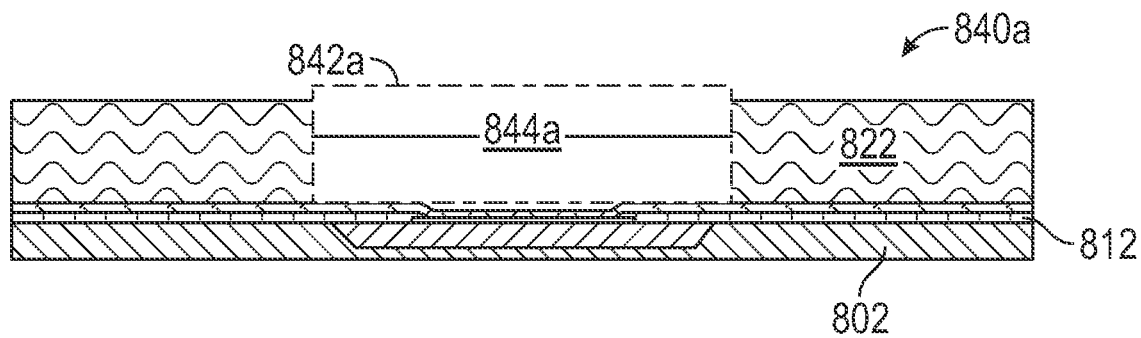
Figure 8E:
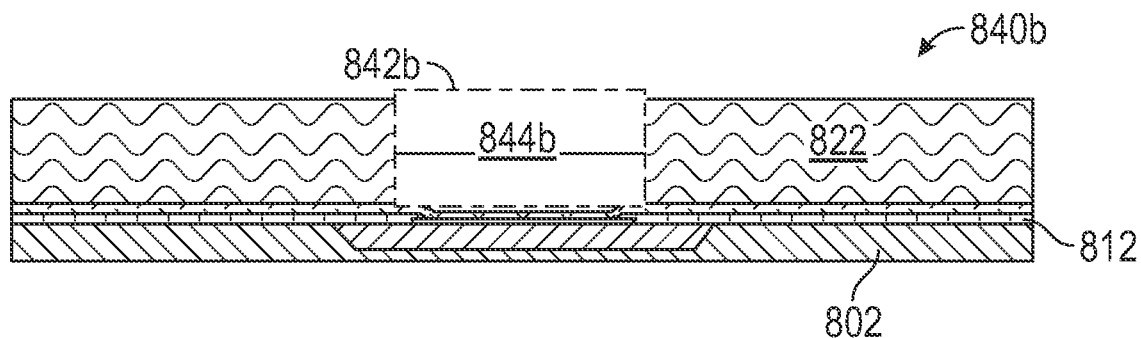
Figure 8F:
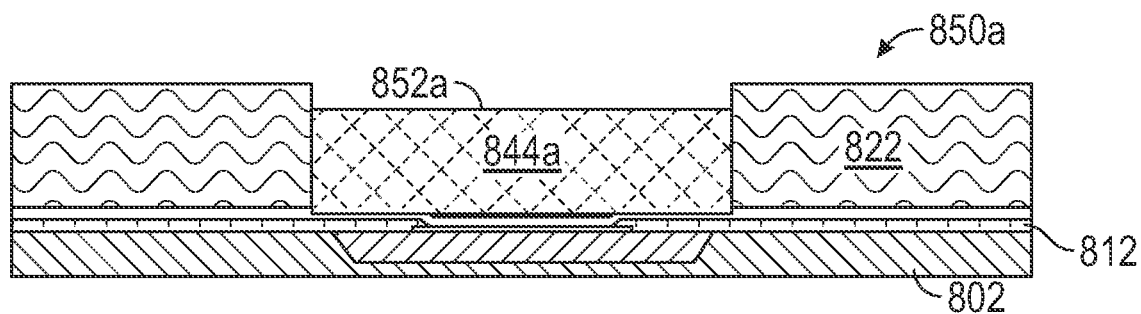
Figure 8G:
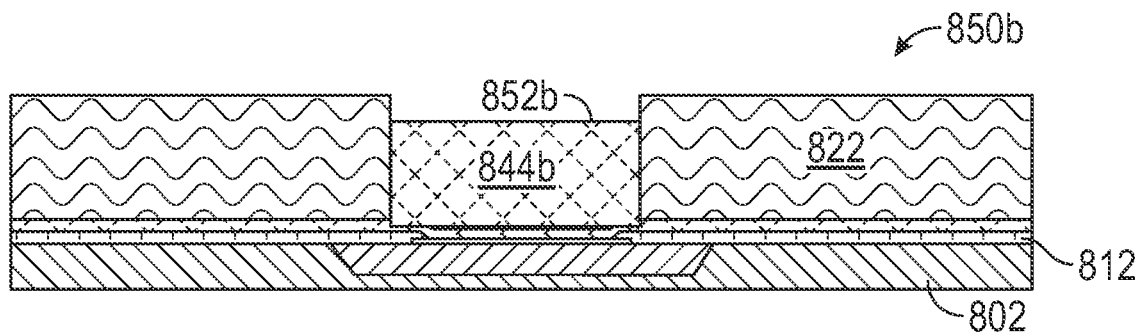

At step 820 in FIG. 8C, the fabricator forms a photo-resist layer 822 on the seed layer 812. At steps 840a and 840b shown in FIGS. 8D and 8E respectively, the fabricator patterns the spaces 842a and 842b. The spaces 842a and 842b have respective diameters 844a and 844b which control the respective size of the spaces formed in the photo-resist layer 822. In some examples, the fabricator forms the space(s) 842a in areas of the wafer 802 where larger interconnects will be located (e.g., solder bumps/interconnects in the first subsets described in relation to FIGS. 2A-6). The fabricator forms spaces 842b in areas of the wafer where smaller interconnects will be located (e.g., solder bumps/interconnects in the second subsets described in relation to FIGS. 2A-6).

Additionally, the fabricator may form/pattern additional other spaces, similar to the spaces 842a-842b, in the photo-resist layer 822 to provide varying diameters/cross-sectional areas of the interconnects in the arrangements of the interconnect layers described above. At steps 850a and 850b shown in FIGS. 8F and 8G, the fabricator plates copper (Cu) in the spaces 842a and 842b in order to form C4 pillars 852a and 852b for an interconnect layer. In some examples, the steps shown in FIGS. 8A-G are a first plating process. The fabricator may also perform a second plating process, such as a liquid resist process, as described in relation to block 704 and FIGS. 9A-F.

Returning back to method 700 of FIG. 7, at block 704, the fabricator forms a plurality of solder plates on the C4 pillars, during a second plating process. In some examples, each solder plate of the plurality of solder plates includes a mass of solder corresponding to a cross-sectional area of a respective C4 pillar the solder plate is formed, where the mass of solder provides for a consistent interconnect height upon solder reflow.

Figure 9A:
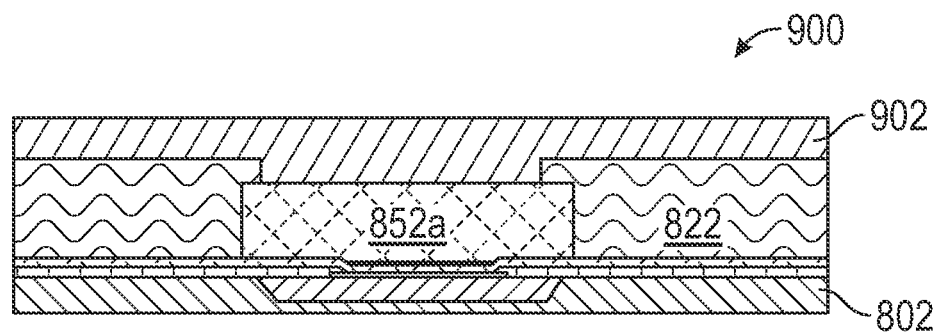
Figure 9B:
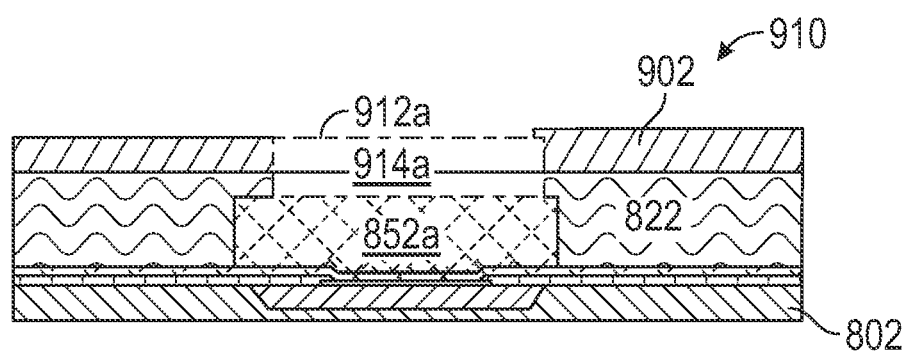
Figure 9C:
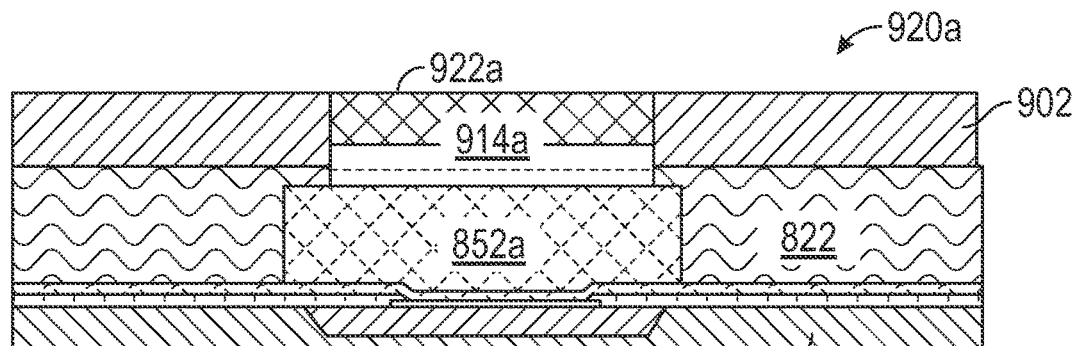
Figure 9D:
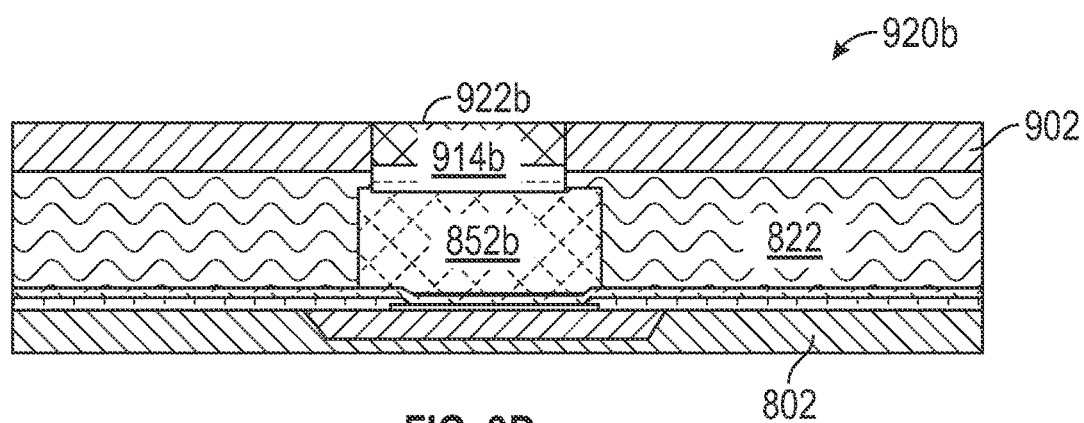
Figure 9E:
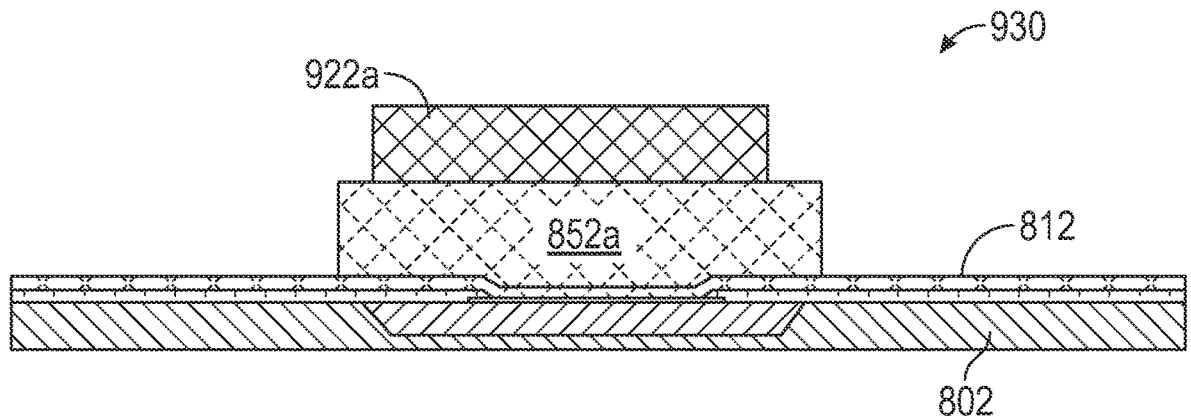
Figure 9F:
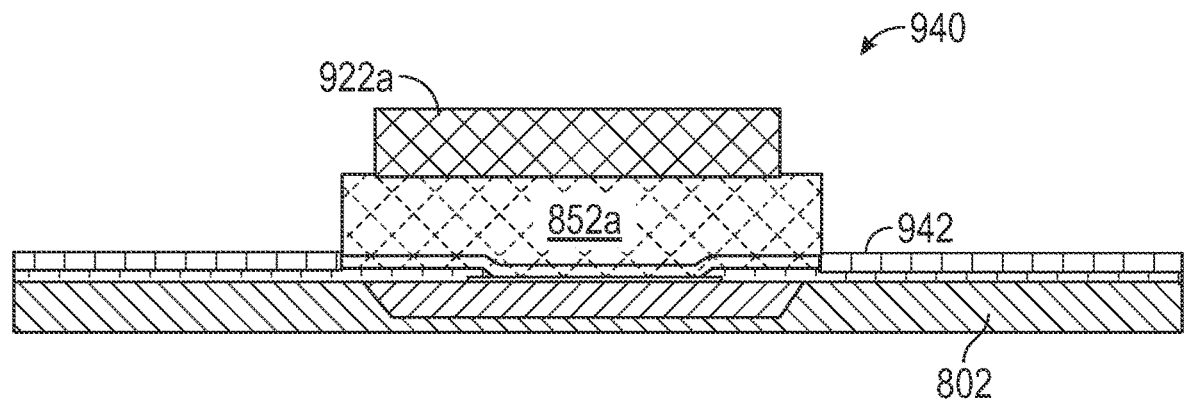

For example, at step 900 in FIG. 9A, the fabricator applies a liquid-resist layer 902 to the C4 pillar 852a and the photo-resist layer 822. At step 910 in FIG. 9B, the fabricator forms/patterns/develops a space 912a in the liquid-resist layer 902. The space 912a includes a diameter 914a. In some examples, the fabricator forms spaces over each C4 pillar in on the wafer 802 where each space has a respective diameter/size. At steps 920a and 920b the fabricator forms the solder plates 922a and 922b as shown in FIGS. 9C and 9D. In some examples, the fabricator forms the solder plates in the spaces created at step 910. For example, the solder plate 922a is formed in the space 912a and has the diameter 914a. In some examples, the mass of the solder plate is dependent on the size/diameter of the associated space. For example, the mass of solder plate 922a is larger than the mass of the solder plater 922b. Further, the mass of solder of each solder plate provides for a consistent interconnect height upon solder reflow during finishing processes of the interconnect layer.

At block 706, the fabricator, during a finishing process, forms a plurality of solder bump interconnects between the first plurality of C4 pillars on the first structure and a second plurality of C4 pillars on a second structure. For example, at step 930 and step 940 shown in FIG. 9E, the fabricator removes the liquid-resist layer 902 and photo-resist layer 822 through stripping processes and removes seed layer 812 through layer etching processes.

Figure 9G:
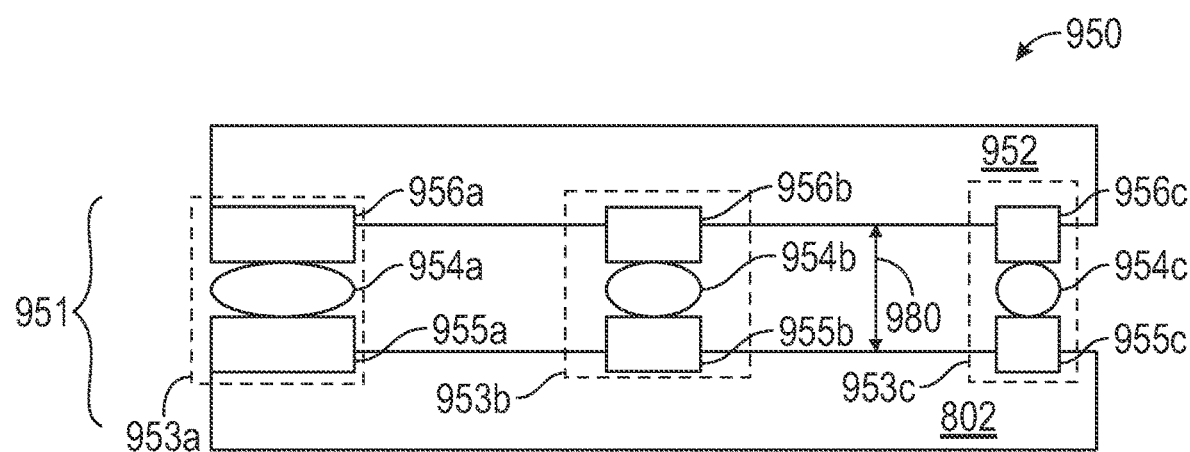

At step 950 in FIG. 9G, the fabricator joins the wafer 802 including the various C4 pillars 955a-955c to a device layer 952 and respective contacts 956a-956c using flip chip joining processes. In some examples, the solder mass of the various plates formed in steps 910-930 provide for standard uniform height 980 in interconnect layer 951 via solder bumps 954a-954c. In some examples, interconnect 953a is an example interconnect in any of the first subsets of interconnects described above, interconnect 953c is an example interconnect in any of the second subsets of interconnects described above, and interconnect 953b is an example interconnect in any of the third subsets of interconnects described above.

Returning back to FIG. 7, at block 708, the fabricator provides an underfill material, such as the underfill material 114, to the plurality of solder bump interconnects, where the underfill material flows along the underfill flow direction, wherein the underfill material fills a space between the first structure and the second structure and between the plurality of solder bump interconnects.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the preceding, reference is made to embodiments presented in this disclosure. However, the scope of the present disclosure is not limited to specific described embodiments. Instead, any combination of the features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages discussed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

What is claimed is:

1. An electronic package comprising:
   a device layer;
   a substrate layer; and
   an interconnect layer positioned between the device layer and the substrate layer, the interconnect layer comprising a plurality of solder bumps arranged with a uniform pitch, wherein:
      a first subset of the plurality of solder bumps comprises solder bumps each having a first cross-sectional area, the first subset arranged along a first position at a first edge of the interconnect layer,
      a second subset of the plurality of solder bumps comprises one or more solder bumps each having a second cross-sectional area, the second subset arranged at a second position of the interconnect layer, and
      a third subset of the plurality of solder bumps is arranged between the first position and the second position, the third subset comprising solder bumps having one or more third cross-sectional areas that cause underfill material, when dispensed into the interconnect layer at the first edge, to flow by capillary action in a flow direction from the first subset toward the second subset, wherein at least one of the one or more third cross-sectional areas is less than the first cross-sectional area and greater than the second cross-sectional area, and wherein the cross-sectional areas of the plurality of solder bumps monotonically decrease along the flow direction.

2. The electronic package of claim 1, further comprising:
the underfill material in the interconnect layer, wherein the underfill material is positioned between the plurality of solder bumps such that the underfill material fills a space between the device layer and the substrate layer.

3. The electronic package of claim 1, wherein the first subset, the second subset, and the third subset comprise a similar cross-sectional shape, wherein the similar cross-sectional shape comprises a circular shape.

4. The electronic package of claim 1, wherein the first subset, the second subset, and the third subset comprise a similar cross-sectional shape, wherein the similar cross-sectional shape comprises an elliptical shape.

5. The electronic package of claim 1, wherein the first subset comprises a circular cross-sectional shape, the second subset comprises an elliptical cross-sectional shape, and the third subset comprises varying elliptical cross-sectional shapes.

6. The electronic package of claim 1, wherein the plurality of solder bumps further comprise a fourth subset, wherein the fourth subset comprises a plurality of fine cross-sectional areas, wherein the fine cross-sectional areas comprise smaller areas than the plurality of solder bumps in surrounding subsets, and wherein within the plurality of fine cross-sectional areas, individual fine cross-sectional areas decrease along the flow direction from the first position to the second position.

7. The electronic package of claim 1, wherein the electronic package comprises a dual chip module comprising a second plurality of solder bumps arranged in the interconnect layer, wherein:
a first subset of the second plurality of solder bumps comprises the first cross-sectional area, and wherein the first subset of the second plurality of solder bumps is arranged along a third position at a second edge of the interconnect layer,
a second subset of the second plurality of solder bumps comprises the second cross-sectional area, and wherein the second subset of the second plurality of solder bumps is arranged at a fourth position of the interconnect layer, and
a third subset of the second plurality of solder bumps is arranged between the third position and the fourth position, wherein the third subset of the second plurality of solder bumps comprises a plurality of cross-sectional areas, wherein within the plurality of cross-sectional areas, individual cross-sectional areas decrease along a second flow direction from the third position to the fourth position.

8. The electronic package of claim 1, wherein the electronic package comprises a quad chip module comprising more than two pluralities of solder bumps arranged in the interconnect layer, wherein each of the two pluralities of solder bumps comprise subsets arranged with a plurality of cross-section areas, and wherein within the plurality of cross-section areas, individual cross-sectional areas decrease along one or more underfill flow directions in the interconnect layer.

9. The electronic package of claim 1, wherein the device layer comprises a first plurality of C4 pillars,
wherein the substrate layer comprises a second plurality of C4 pillars, and
wherein the plurality of solder bumps provides a connection between the first and second plurality of C4 pillars.

10. An interconnect layer for an electronic device comprising:
a plurality of solder bumps arranged with a uniform pitch, wherein:
a first subset of the plurality of solder bumps comprises solder bumps each having a first cross-sectional area, and wherein the first subset is arranged along a first position at a first edge of the interconnect layer,
a second subset of the plurality of solder bumps comprises one or more solder bumps each having a second cross-sectional area, and wherein the second subset is arranged at a second position of the interconnect layer, and
the plurality of solder bumps have a plurality of cross-sectional areas, wherein individual cross-sectional areas decrease along an underfill flow direction from the first position to the second position, the plurality of cross-sectional areas causing underfill material, when dispensed into the interconnect layer at the first edge, to flow by capillary action in the underfill flow direction,
wherein at least one of the plurality of solder bumps arranged between the first subset and the second subset has a third cross-sectional area that is less than the first cross-sectional area and greater than the second cross-sectional area, and
wherein the cross-sectional areas of the plurality of solder bumps monotonically decrease along the underfill flow direction.

11. The interconnect layer of claim 10, further comprising:
the underfill material in the interconnect layer, wherein the underfill material is positioned between the plurality of solder bumps such that the underfill material fills a space between the a device layer and a substrate layer in an electronic package.

12. The interconnect layer of claim 10, wherein the first subset and the second subset comprise a similar cross-sectional shape, wherein the similar cross-sectional shape comprises a circular shape.

13. The interconnect layer of claim 10, wherein the first subset, the second subset, and the third subset comprise a similar cross-sectional shape, wherein the similar cross-sectional shape comprises an elliptical shape.

14. The interconnect layer of claim 10, wherein the first subset comprises a circular cross-sectional shape, the second subset comprises an elliptical cross-sectional shape, and the third subset comprises varying elliptical cross-sectional shapes.

15. The interconnect layer of claim 10, wherein the plurality of solder bumps further comprise a fourth subset, wherein the fourth subset comprises a plurality of fine cross-sectional areas, wherein the fine cross-sectional areas comprise smaller areas than the plurality of solder bumps in surrounding subsets, and wherein within the plurality of fine cross-sectional areas, individual fine cross-sectional areas decrease along the underfill flow direction from the first position to the second position.

16. The interconnect layer of claim 10, wherein the interconnect layer comprises an interconnect layer in a dual chip module comprising a second plurality solder bumps arranged in the interconnect layer, wherein:
- a first subset of the second plurality of solder bumps comprises the first cross-sectional area, and wherein the first subset of the second plurality of solder bumps is arranged along a third position at a second edge of the interconnect layer,
- a second subset of the second plurality of solder bumps comprises the second cross-sectional area, and wherein the second subset of the second plurality of solder bumps is arranged at a fourth position of the interconnect layer, and
- a third subset of the second plurality of solder bumps is arranged between the third position and the fourth position, wherein the third subset of the second plurality of solder bumps comprises a plurality of cross-sectional areas, wherein within the plurality of cross-sectional areas, individual cross-sectional areas decrease along a second underfill flow direction from the third position to the fourth position.

17. The interconnect layer of claim 10, wherein the interconnect layer comprises an interconnect layer in comprises a quad chip module comprising a more than two pluralities of solder bumps arranged in the interconnect layer, wherein each of the two pluralities of solder bumps comprise subsets arranged with a plurality of cross-section areas, and wherein within the plurality of cross-section areas, individual cross-sectional areas decreases along one or more underfill flow directions in the interconnect layer.

18. A method comprising:
- during a first plating process, forming a first plurality of C4 pillars on a first structure, wherein the first plurality of C4 pillars comprise a plurality of cross-sectional areas, wherein within the plurality of cross-sectional areas, individual cross-sectional areas monotonically decrease along an underfill flow direction between a first subset of the first plurality of C4 pillars to a second subset of the first plurality of C4 pillars, the plurality of cross-sectional areas comprising a first cross-sectional area of the first subset, a second cross-sectional area of the second subset, and at least one intermediate cross-sectional area;
- during a second plating process, forming a plurality of solder plates on the C4 pillars, wherein each solder plate of the plurality of solder plates comprises a mass of solder corresponding to a cross-sectional area of a respective C4 pillar on which the solder plate is formed, wherein the mass of solder provides for a consistent interconnect height upon solder reflow; and
- during a finishing process, forming a plurality of solder bump interconnects between the first plurality of C4 pillars on the first structure and a plurality of contacts on a second structure, the plurality of solder bump interconnects having a uniform pitch, the plurality of cross-sectional areas causing underfill material, when dispensed between the first structure and the second structure, to flow by capillary action in the underfill flow direction.

19. The method of claim 18, further comprising:
providing the underfill material to the plurality of solder bump interconnects, wherein the underfill material flows along the underfill flow direction and fills a space between the first structure and the second structure and between the plurality of solder bump interconnects.

20. The method of claim 19, wherein the first plating process comprises a photo-resist process, and wherein the second plating process comprises a liquid resist process.

* * * * *